United States Patent [19]

Baghdadi et al.

[11] 4,196,041
[45] Apr. 1, 1980

[54] SELF-SEEDING CONVERSION OF POLYCRYSTALLINE SILICON SHEETS TO MACROCRYSTALLINE BY ZONE MELTING

[75] Inventors: Aslan Baghdadi; Richard W. Gurtler, both of Mesa, Ariz.

[73] Assignee: Motorola, Inc., Schaumburg, Ill.

[21] Appl. No.: 785,485

[22] Filed: Apr. 7, 1977

Related U.S. Application Data

[63] Continuation of Ser. No. 656,556, Feb. 9, 1976, abandoned.

[51] Int. Cl.² .................. B01J 17/08; B01J 17/20; C01B 33/02
[52] U.S. Cl. .................. 156/620; 156/DIG. 64; 156/DIG. 88; 156/DIG. 65; 156/DIG. 80; 422/250
[58] Field of Search ............ 156/DIG. 64, DIG. 88, 156/DIG. 65, 620, DIG. 62, DIG. 84, DIG. 97, DIG. 80; 23/273 Z, 273 SP; 422/250

[56] References Cited

U.S. PATENT DOCUMENTS

| | | | |
|---|---|---|---|
| 2,789,039 | 4/1957 | Jensen | 156/617 H |
| 2,992,903 | 7/1961 | Imber | 156/DIG. 88 |
| 3,031,275 | 4/1962 | Shockley | 156/DIG. 97 |
| 3,287,107 | 11/1966 | Eaton | 156/DIG. 102 |
| 3,293,002 | 12/1966 | Spielmann | 156/DIG. 88 |
| 3,348,962 | 10/1967 | Grossman | 156/DIG. 88 |
| 3,600,237 | 8/1971 | Davis | 156/DIG. 88 |
| 3,977,934 | 8/1976 | Lesk | 156/DIG. 88 |
| 3,996,094 | 12/1976 | Lesk | 156/DIG. 88 |

FOREIGN PATENT DOCUMENTS 1383400 2/1975 United Kingdom ............... 156/616 R

OTHER PUBLICATIONS

Pfann et al., Improvement in Floating Zone Technique, J of Appl. Phys., vol. 30, 1959, pp. 454-455.
Lawson et al., Preparation of Single Crystals, London, 1958, pp. 11, 14, 15, 26, 27, 28.

*Primary Examiner*—Stephen J. Emery
*Attorney, Agent, or Firm*—John A. Fisher

[57] ABSTRACT

A polycrystalline semiconductor sheet may be converted to a monocrystalline or macrocrystalline semiconductor sheet through use of a geometric restriction in the sheet. The process requires formation of a region of the sheet having a small width compared to the width of the remainder of the sheet. A molten zone is formed in the small width region of the sheet. At least a portion of the molten zone is allowed to solidify into a single crystal or crystals of large size of the semiconductor material coextensive with the small width of the region at the portion of the molten zone so solidified. The molten zone is then moved from the small width region of the sheet into the remainder of the sheet. The sheet is allowed to solidify successively as the molten zone passes along it. As a result, the macrocrystal formed in the narrow width region of the sheet propagates into the remainder of the sheet through which the molten zone passes. This process allows formation of high modified semiconductor material without requiring use of a seed crystal.

3 Claims, 4 Drawing Figures

SELF-SEEDING CONVERSION OF POLYCRYSTALLINE SILICON SHEETS TO MACROCRYSTALLINE BY ZONE MELTING

RELATED APPLICATIONS

This is a continuation, of application Ser. No. 656,556, filed Feb. 9, 1976 and now abandoned.

This invention is an improvement in the process disclosed in copending, commonly assigned application Ser. No. 538,214, filed in the name of Israel A. Lesk on Jan. 2, 1975, and entitled, "Silicon Manufacture", now abandoned. It is also related to copending, commonly assigned application Ser. No. 645,857, filed by Baghdadi et al on Dec. 31, 1975, now abandoned. The present application is of material assistance in carrying out such processes on a practical basis.

FIELD OF THE INVENTION

This invention relates to an improved process for converting a polycrystalline semiconductor sheet into a semiconductor sheet having a modified crystal structure suitable for solar cells. More particularly, it relates to such a conversion process of the type in which a molten zone is passed through a sheet of semiconductor material in order to convert the sheet from polycrystalline semiconductor material to monocrystalline or macrocrystalline semiconductor material. Most especially, the invention relates to a method for forming a single crystal in a polycrystalline semiconductor sheet, which is then propagated throughout the sheet to convert the sheet to monocrystalline semiconductor material.

DESCRIPTION OF THE PRIOR ART

As pointed out in the above-referenced Baghdadi et al application, there is a need for a process capable of producing a high volume of semiconductor sheet material at a very low cost, in order to meet projected demands for use in fabrication of semiconductor solar energy devices as alternative primary electrical energy generation facilities to present day conventional energy sources. The Czochralski method for growing ingots of single crystal semiconductor material which is sliced, lapped and polished to produce thin wafers used in the fabrication of integrated circuits and other microelectronic devices is not suitable for this purpose, because such techniques are too expensive.

Some proposals have been made for forming ribbon-like semiconductor sheet structures directly from a melt, as in U.S. Pat. Nos. 3,096,158 and 3,293,002, but such techniques have not found acceptance in practice.

SUMMARY OF THE INVENTION

Accordingly, it is an object of this invention to provide a reliable method for inducing the formation of single crystals coextensive with a semiconductor sheet that does not require use of a seed crystal.

It is another object of the invention to use a geometric shape of a semiconductor sheet as an aid in forming a crystal which may be propagated throughout the sheet.

It is another object of the invention to use a geometric shape to induce the formation of a crystal in a semiconductor sheet, which may then be propogated throughout the sheet by use of a shaped molten zone.

The attainment of these and related objects may be achieved through use of the novel semiconductor sheet material conversion process herein disclosed. The process converts a polycrystalline semiconductor sheet to a monocrystalline or macrocrystalline semiconductor sheet. A macrocrystalline structure is a structure in which the crystals are of sufficiently large size so as to permit semiconductor action. Therefore, a monocrystalline sheet wherein the sheet is but a true single crystalline body is encompassed within the term macrocrystalline. To carry out the process, a geometric constriction, or a region of the sheet having a small width compared to the width of the remainder of the sheet, is formed. A molten zone is formed in the small width region of the sheet. A portion of the molten zone is allowed to solidify into a single crystal of the semiconductor material coextensive with the small width of the region at the portion of the molten zone so solidified. The molten zone is then moved into the remainder of the sheet. The sheet is allowed to solidify successively as the molten zone passes along it, resulting in propagation of the modified crystallinity into the remainder of the sheet through which the molten zone passes. Preferably, the molten zone has a trailing boundary as it passes through the sheet which is shaped to prevent dislocations at the edges of the sheet from propagating into the sheet. Specifically, the trailing boundary of the molten zone is desirably arcuate shaped, with a centrally located portion extending further along the sheet in the direction of travel of the molten zone than the portions of the trailing boundary proximate to the edges of the sheet.

While the process of this invention is particularly suited for use with a polycrystalline silicon sheet used in the fabrication of silicon solar energy devices, other semiconductor materials, such as germanium, compound semiconductors, such as gallium arsenide, cadmium sulfate, and the like may be employed as well. The region of the sheet having a small width compared to the width of the remainder of the sheet may be either a pointed tip forming an end of the sheet or a constriction in the sheet, with wider portions of the sheet above and below the constriction.

The attainment of the foregoing and related objects, advantages and features of the invention should be readily apparent after review of the following more detailed description of the invention, taken together with the drawings, in which:

DETAILED DESCRIPTION OF THE INVENTION

Figure 1:
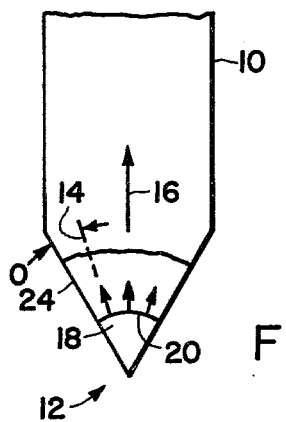
FIG. 1 is a plan view of a polycrystalline silicon ribbon shown at the time of beginning the process of this invention.

Turning now to the drawings, more particularly to FIG. 1, there is shown a polycrystalline silicon ribbon 10 having a pointed end 12. A molten zone 14 has been created in the polycrystalline silicon ribbon 10 by means of a partially defocused laser beam in air or other oxidizing atmosphere in accordance with the process taught in the above-referenced Baghdadi et al application, the disclosure of which is hereby incorporated by reference herein. At the time of its formation, molten zone 14 extends to the end of tip 12. After its formation, the molten zone 14 is moved along the polycrystalline silicon ribbon 10 in the direction shown by arrow 16. As the molten zone 14 moves away from tip 12, a single crystal 18 is formed at the tip 12. As the melt region 14 moves upward, single crystal 18 enlarges as successive cooling occurs until essentially the entire width of the ribbon is the same orientation of single crystal material. Because of certain defects therein, the sheet may not be monocrystalline and therefore it can be considered macrocrystalline. For this purpose, the shape of trailing edge interface 20 between the molten zone and the single crystal 18 is important. It is desirable that the angle $\phi$ between growth vectors 22 and the edge 24 of the sheet be small, in the tip area of the polycrystalline silicon ribbon 10, and zero or negative after the single crystal 18 has moved out of the tip region. These constraints will prevent edge dislocations from propagating inward into the ribbon 10. The shape of trailing egde boundary 20 may conveniently be controlled by either nonlinear scanning of the laser beam used to produce the molten zone 14 or by powder modulation of the laser beam.

Figure 2:
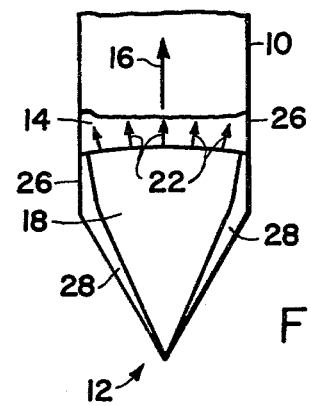
FIG. 2 is a similar plan view, but showing the ribbon later in the practice of the invention.

FIG. 2 shows the polycrystalline silicon ribbon 12 after single crystal 18 has been propagated past tip 12 of the ribbon. Since growth vectors 22 for the single crystal 18 point outward to edges 26 of the polycrystalline silicon ribbon 10, i.e., the angle $\phi$ as shown in FIG. 1 is negative, propagation of edge dislocations into the macrocrystalline sheet will not occur. Continued travel of the molten zone 14 in the direction shown by arrows 16 will therefore result in complete conversion of the polycrystalline silicon ribbon 10 to single crystal 18. That portion of the thus converted ribbon 10 containing edge influenced regions 28 may be discarded as scrap.

Figure 3:
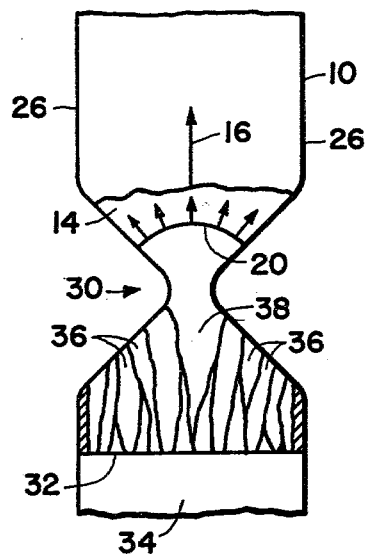
FIG. 3 is a plan view of another form of polycrystalline silicon ribbon showing further practice of the invention.

FIG. 3 shows another example of practice of the present process. Polycrystalline silicon ribbon 10 has a constricted region 30 along its length. A molten zone is formed at starting point 32 in the ribbon 10, below the restriction 30. Portion 34 of the ribbon 10 remains small grained polycrystalline material. Large grains 36 are formed in the polycrystalline silicon ribbon 10 below restriction 30 as the molten zone moves toward restriction 30. As the molten zone 14 moves into the restriction 30, a centrally located crystal grain 38 passes through the restriction 30, but the remaining large crystals 36 are blocked from passing through the restriction 30. As before, trailing edge boundary 20 is made arcuate in shape with its central portion further along the path of travel shown by arrow 16 than its edge portions. This ensures that the crystal 38 will propagate to the edges 26 of polycrystalline silicon ribbon 10 and that edge dislocations will not propagate significantly into the ribbon 10, as in the FIG. 2 embodiment.

In practice, the molten zone 14 is desirably moved through the polycrystalline ribbon 10 by moving the polycrystalline silicon ribbon past the pratically defocused laser beam or other source of heat energy. The rate at which the polycrystalline ribbon 10 may be moved past the laser beam obviously depends on the level of energy imparted by the laser beam. With a low powdered laser, feed rates of less than one inch per minute are required. However, with the use of higher powered lasers, feed rates of up to 10 inches per minute may be obtained. For a feed rate of 0.1 inch per minute and a laser supplying 220 watts of power, a silicon ribbon 0.01 inch thick may be converted to macrocrystalline silicon in this process. To increase the feed rate to about 1 inch per minute, about 500 watts of power from the laser would be required.

Figure 4:
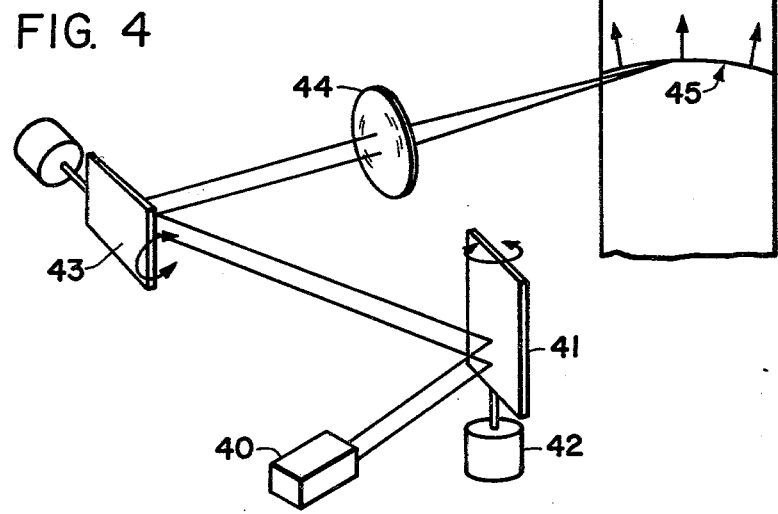
FIG. 4 is a schematic of apparatus for effecting the process.

An apparatus for maintaining the arcuate shape of the molten zone which limits the propagation of defects from the edges of the sheet is schematically depicted in FIG. 4 and includes a laser energy source 40 directed onto a first mirror 41. First mirror 41 is driven in an oscillatory motion about a generally vertical axis by a motor drive 42. A second mirror 43 is mounted in the path of the rays from first mirror 41 to direct the laser energy through a focusing lens system 44 onto the web 10. The second mirror 43 is driven in an oscillatory motion about an axis perpendicular to the mounting axis of first mirror 41, i.e., a generally horizontal axis. It will be appreciated that if first mirror 41 is moved at a frequency, f, while mirror 43 is stationary the molten zone would be a straight line across the ribbon. With second mirror 43 oscillating at a frequency, 2f, an arcuate shape 45 for the molten zone is attained. By modifying the frequency of oscillation of either or both mirrors and/or modulation of the beam energy any desired shape of molten zone may be maintained.

It should now be apparent that a process capable of achieving the stated objects of the invention has been provided. The process allows the conversion of polycrystalline silicon material to macrocrystalline silicon material without the use of seed crystal. Once a single crystal has been formed in either the tip of a polycrystalline silicon ribbon or a constriction along the length of the ribbon, controlling the shape of the molten zone allows that single crystal to be propagated throughout the semiconductor ribbon or sheet by passing the molten zone along the sheet or ribbon. As a result, macrocrystalline material suitable for fabrication of solar energy devices and other semiconductor devices is obtained in a low cost, high volume process.

It should be readily apparent to the art skilled that various changes can be made in the process as described above. It is intended that such changes be covered within the spirit and scope of the claims appended hereto.

What is claimed is:

1. A self-seeding process for converting an unsupported, substrate-free polycrystalline semiconductor silicon sheet to a macrocrystalline semiconductor silicon sheet, which comprises:
   (a) forming a region of said sheet having a small width compared to the width of the remainder of said sheet,
   (b) heating said small width region in an oxidizing atmosphere to form a molten zone in said small width region of said sheet,
   (c) allowing a portion of said molten zone to solidify into a seed crystal of the semiconductor silicon material substantially coextensive with the small width of said region at the portion of the molten zone so solidified,
   (d) expanding and axially moving the molten zone to encompass the full width of the sheet, and continuing axially moving moving the molten zone along the remainder of said sheet,
   (e) allowing said sheet to solidify successively as said molten zone passes along it, said molten zone having a trailing boundary which is arcuate shaped with a centrally located portion of said trailing boundary extending further along said sheet in the direction of travel of said molten zone than portions of said trailing boundary proximate to the edges of said sheet, whereby said single seed crystal propagates into the remainder of said sheet through which said molten zone passes.

2. The process of claim 1 in which said small width region comprises a substantially pointed tip forming an end of said sheet.

3. The process of claim 1 in which said small width region comprises a constriction in said sheet, and in which said molten zone is initially formed below said constriction in the pass of travel of said molten zone through said sheet to create at least a larger grain crystal portion below said constriction which is coextensive in width with said constriction when said molten zone is moved into said constriction, said larger grain single crystal portion propagating into said sheet above said constriction, whereby said sheet above said constriction in the path of travel of said molten zone is converted from polycrystalline semiconductor material to macrocrystalline semiconductor material.

* * * * *